United States Patent [19]
Kita

[11] Patent Number: 5,028,554
[45] Date of Patent: Jul. 2, 1991

[54] PROCESS OF FABRICATING AN MIS FET

[75] Inventor: Akio Kita, Tokyo, Japan

[73] Assignee: Oki Electric Industry Co., Ltd., Tokyo, Japan

[21] Appl. No.: 347,927

[22] Filed: May 5, 1989

Related U.S. Application Data

[62] Division of Ser. No. 67,413, Jun. 19, 1987, Pat. No. 4,873,557.

[30] Foreign Application Priority Data

Jul. 3, 1986 [JP] Japan .................... 61-155089

[51] Int. Cl.⁵ ........................... H01L 21/265
[52] U.S. Cl. ........................ 437/44; 437/41;
437/192; 437/200; 437/931; 357/23.3;
148/DIG. 105; 148/DIG. 147
[58] Field of Search ............ 437/40, 41, 44, 192,
437/200, 27, 931; 357/23.3, 23.9; 148/DIG.
147, DIG. 105

[56] References Cited

U.S. PATENT DOCUMENTS

| | | | |
|---|---|---|---|
| Re. 32,613 | 2/1988 | Lepselter et al. | 437/200 |
| 4,343,082 | 8/1982 | Lepselter et al. | 437/200 |
| 4,419,809 | 12/1983 | Riseman et al. | 437/41 |
| 4,488,351 | 12/1984 | Momose | 437/34 |
| 4,575,920 | 3/1986 | Tsunashima | 437/192 |
| 4,587,718 | 5/1986 | Haken et al. | 437/200 |
| 4,663,191 | 5/1987 | Choi et al. | 437/200 |
| 4,669,176 | 6/1987 | Kato | 437/200 |
| 4,683,645 | 8/1987 | Naguib et al. | 437/41 |
| 4,740,484 | 4/1988 | Norström et al. | 437/44 |
| 4,774,201 | 9/1988 | Woo et al. | 437/200 |
| 4,774,204 | 9/1988 | Havemann | 437/34 |
| 4,788,160 | 11/1988 | Havemann | 437/200 |
| 4,816,423 | 3/1989 | Havemann | 437/200 |
| 4,855,247 | 8/1989 | Ma et al. | 437/44 |

FOREIGN PATENT DOCUMENTS

| | | | |
|---|---|---|---|
| 0157024 | 12/1981 | Japan | 437/200 |
| 0138075 | 8/1983 | Japan | 437/200 |
| 0078575 | 5/1984 | Japan | 437/44 |
| 0200418 | 11/1984 | Japan | 437/200 |
| 0138916 | 7/1985 | Japan | 437/200 |
| 0096764 | 5/1986 | Japan . | |
| 0097975 | 5/1986 | Japan . | |
| 0101075 | 5/1986 | Japan . | |
| 0240631 | 10/1986 | Japan | 437/200 |
| 0287227 | 12/1986 | Japan | 437/200 |
| 2149206 | 6/1985 | United Kingdom | 437/200 |
| 8700967 | 2/1987 | World Int. Prop. O. | 437/200 |

OTHER PUBLICATIONS

Alperin et al., "Development of the Self-Aligned Titanium Silicide Procees for VLSI Applications", IEEE Journal of Solid-State Circuits, vol. SC-20, No. 1, Feb. 1985, pp. 61-69.

Codella et al., "Submicron IGFET Device with Double Implanted Lightly Doped Drain/Source Structure", IBM Technical Disclosure Bulletin, Vol. 26, No. 12, May 1984, pp. 6584-6586.

Author Unknown, "Simplified Lightly Doped Drain Process", IBM Technical Disclosure Bulletin, vol. 30, No. 12, May 1988, pp. 180-181.

Primary Examiner—Olik Chaudhuri
Assistant Examiner—M. Wilczewski
Attorney, Agent, or Firm—Spencer & Frank

[57] ABSTRACT

An LDD MIS FET comprises a silicide over the lightly doped regions to reduce the parasitic resistance and to prevent the depletion of the lightly-doped regions, reducing the hot carrier injection effect. By the provision of the silicide, the overall parasitic resistance can be made low. Moreover, the increase in the resistance of the lightly-doped region due to the negative charge being trapped at the interface of or in the oxide film over the lightly-doped region and the resultant degradation in the characteristic are eliminated.

10 Claims, 5 Drawing Sheets

FIG. IA
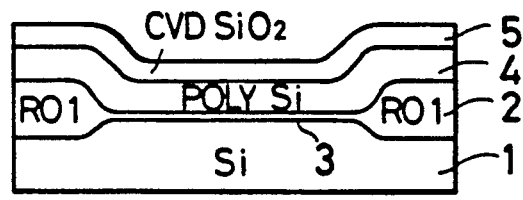
FIG. IB
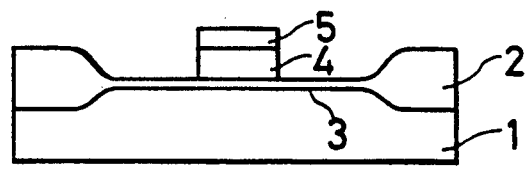
FIG. IC
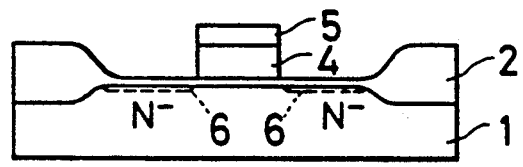
FIG. ID
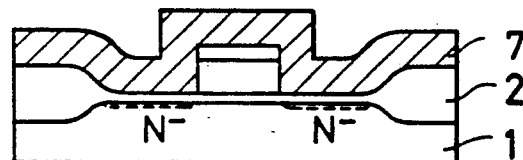
FIG. IE
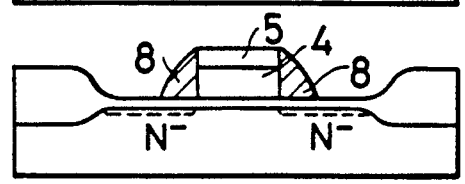
FIG. IF
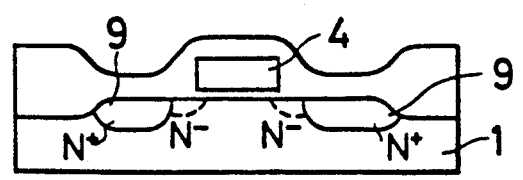
PRIOR ART

PROCESS OF FABRICATING AN MIS FET

This is a Division of application Ser. No. 07/067,413 filed Jun. 19, 1987, now U.S. Pat. No. 4,875,557.

BACKGROUND OF THE INVENTION

The present invention relates to a method of making a MIS (Metal Insulator Semiconductor) FET (Field Effect Transistor) of a miniature structure with reduced hot carrier effect.

To increase the degree of integration, the size of the MIS FET must be reduced. When the channel length of a MIS FET is reduced, the electric field proximate to the drain is intensified and hot carriers are generated. The hot carriers can be injected into the gate dielectric film deteriorating the device characteristics. To alleviate the intensity of the electric field, the LDD (Lightly Doped Drain) structure is employed.

An example of the LDD structure is disclosed in the IEEE Transactions on Electron Devices, Vol. ED-29, No. 4, April 1982, pp. 590–596, "Fabrication of High-Performance LDDFET's with Oxide Sidewall-Spacer Technology", Tsang, et al. This LDDFET is described with reference to FIGS. 1A to 1F.

As illustrated in FIG. 1A, a silicon substrate 1 is prepared, on which a field oxide film 2, a gate oxide film 3, a polycrystalline silicon (poly-Si) film 4 and a CVD SiO$_2$ film 5 (SiO$_2$ film formed by chemical vapor deposition) are formed in turn.

Next, as illustrated in FIG. 1B, the CVD SiO$_2$ film 5 and the poly-Si film 4 are pattterned. The patterned poly-Si film 4 constitutes a gate electrode.

Next, as illustrated in FIG. 1C, ion-implantation is performed using the patterned films 5 and 4 as a mask (i.e., by self-alignment) to form N-regions (lightly-doped regions) 6 in the silicon substrate 1.

Next, as illustrated in FIG. 1D, a CVD SiO$_2$ film 7 is deposited over the entire surface.

Next, as illustrated in FIG. 1E, RIE (reactive ion etching) is performed to form sidewalls 8.

Next, as illustrated in FIG. 1F, ion-implantation is performed using the patterned films 5 and 4, and the sidewalls 8 as a mask (i.e., by self-alignment) to form N+ regions (heavily-doped regions) 9.

Subsequently, and interlayer insulating film is deposited, and a contact is opened and an Al (aluminum) conductor layer 10 is formed to obtain an LDDFET as shown in FIG. 2.

In this way, the lightly-doped regions are formed under the sidewalls 8 to alleviate the electric field intensity.

The above-described conventional LDD structure has a problem in that if the N$^-$ region is formed to minimize the electric field near the drain, the impurity concentration of the N$^-$ region is on the order of $10^{17}$ cm$^{-3}$, so that the parasitic resistance between the source and the drain is increased and the conductance is descreased, Moreover, when a negative change is trapped in the oxide film over the N$^-$ region, the N$^-$ region is depleted and a substantial degradation results.

SUMMARY OF THE INVENTION

An object of the invention is to provide an LDD MIS FET in which the hot carrier injection effect is small and the source and drain parasitic resistance is small, and which has a superior performance.

An LDD MIS FET according to the invention comprises a silicide coating over the lightly doped regions to reduce the parasitic resistance and to prevent the depletion of the lightly-doped regions, reducing the hot carrier injection effect. The impurity concentration in the lightly-doped region can be reduced to a level that minimizes the electric field intensity. Moreover, the increase in the resistance of the lightly-doped region due to the negative charge being trapped at the interface of or in the oxide film over the lightly-doped region and the resultant degradation in the characteristic are eliminated.

BRIEF DESCRIPTION OF THE DRAWINGS

In the accompanying drawings:

FIGS. 1A to 1F are cross sections showing various steps in the fabrication of a prior art MIS FET;

DESCRIPTION OF THE PREFERRED EMBODIMENTS

Figure 2:
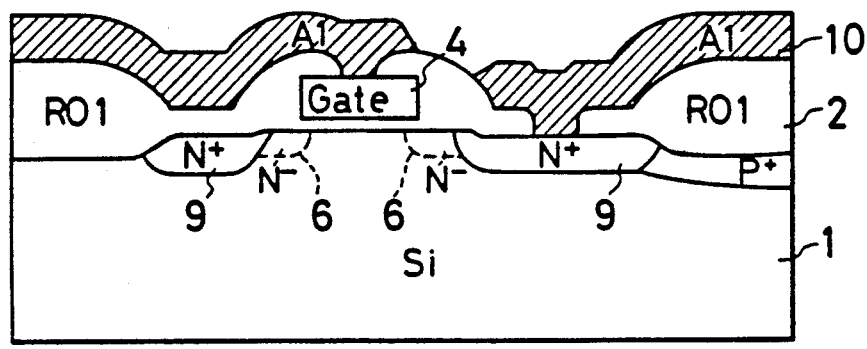
FIG. 2 is cross section showing a completed prior art MIS FET.
Figure 3:
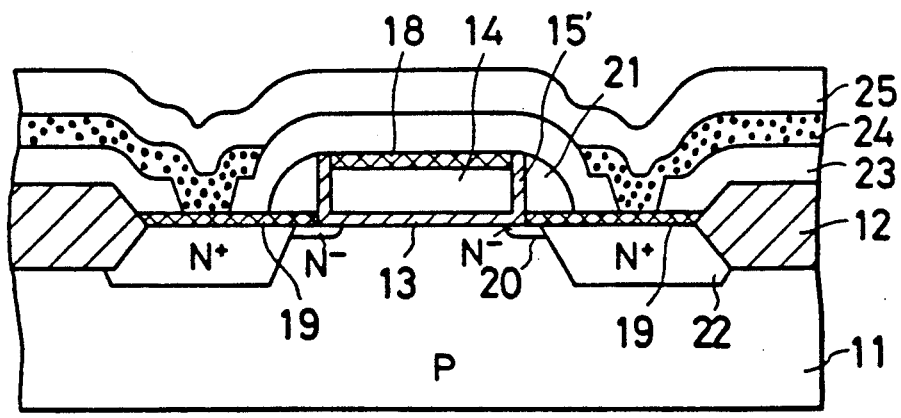
FIG. 3 is a cross section showing a MIS FET of an embodiment of the invention.

FIG. 3 shows an embodiment of an LDD MIS FET according to the invention.

As illustrated, the MIS FET comprises a P-type silicon substrate 11, a gate insulation film 13 formed on the substrate 11, and a gate electrode 14 formed on the gate insulation film 13, i.e. separated from the substrate 11 by the gate insulation film 13. Provided on the sides of the gate electrode 14 are oxide films 15' formed by thermal oxidation of the gate electrode polysilicon.

A titanium silicide film 18 is formed on the gate electrode 14 and titanium silicide films 19 are formed on the doped regions in the substrate 11 adjacent the gate electrode 14. The titanium silicide films 18 and 19 are electrically insulated from each other.

Each of the N-type doped regions constituting the source and drain comprises two parts. The first part 20 adjacent the channel under the gate electrode 14 is an N$^-$ region formed by doping phosphorus (P) at a low dose. A second part 22 separated from the channel by the first part 20 is an N$^=$ region formed by ion-implantation using the gate electrode 14 and a spacer 21 as a mask, i.e., by self-alignment.

The spacer 21 is formed on each side of the gate electrode 14 by subjecting a layer of polysilicon to an anistropic etching.

An inter-layer insulating film 23, a metal wiring conductor 24 and a protective layer 25 are also provided.

Fabrication of the MIS FET is shown in and described with reference to FIGS. 4A to 4H.

Figure 4A:
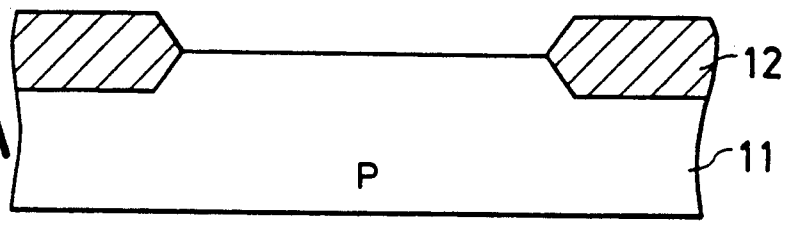
FIGS. 4A to 4H are cross sections showing various steps in the fabrication of the MIS FET of the embodiment of FIG. 3.

First, a P-type silicon substrate 11 is prepared, and field oxide films 12 of a thickness of about 700 nm are formed by selective oxidation, i.e., local oxidation of silicon (LOCOS) to result in a structure shown in FIG. 4A.

Figure 4B:
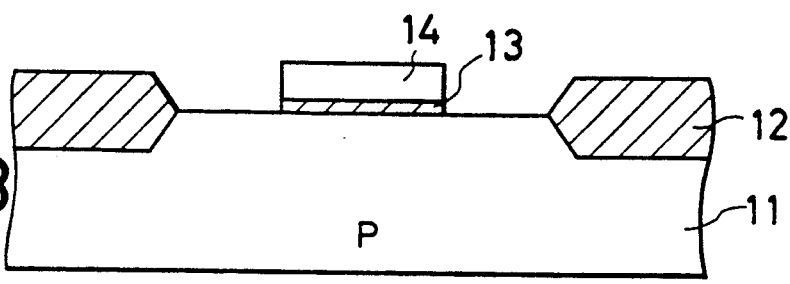

Next, a gate insulation film 13 of a thickness of about 25 nm is formed on the exposed surface of the silicon substrate 11 in an oxidizing atmosphere of 900° to 1000° C. Then a polysilicon layer 14 (which will become a gate electrode) is deposited on the gate insulation film 13 to a thickness of about 300 to 400 nm by CVD (chemical vapor deposition). To impart conductivity, the polysilicon layer 14 is doped with phosphorus (P) at a concentration of $3 \times 10^{20}$ cm$^{-3}$. Next, a photolithography technique is used to form a partterned photoresist layer (not shown), and using the patterned photoresist layer as a mask, an etching is performed to remove the unnecessary part (part other than the gate electrode part) of the polysilicon layer. For this etching, a dry etching apparatus with an SF$_6$ gas is employed. Using the patterned gate electrode as a mask, the exposed gate oxide is etched. The etchant used for this etching is an aqueous solution of hydrofluoric acid. The resultant structure is shown in FIG. 4B.

Figure 4C:
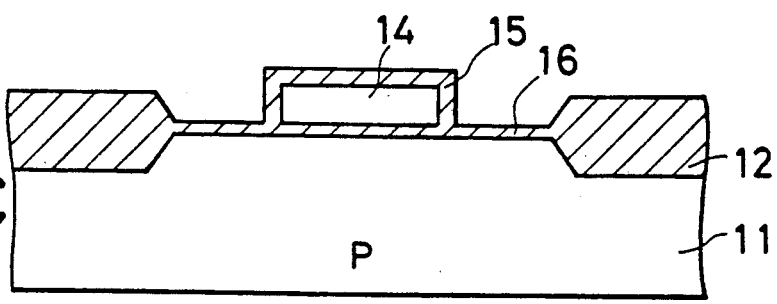
Figure 4D:
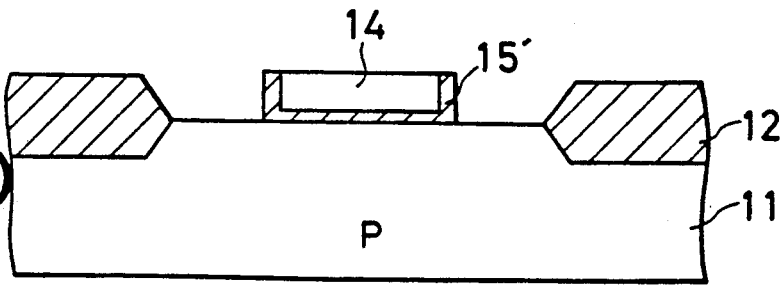

Next, a wet oxidizing atmosphere of relatively low temperature of about 850° C. is used to form a relatively thick oxide film 15 on the polysilicon layer 14 and a relatively thin oxide film 16 on the exposed surface of the silicon substrate 11. The thickness ratio between the oxide film on the polysilicon 14 and the silicon substrate 11 depend mainly on the oxidizing temperature, partial pressure of water vapor in the oxidizing atmosphere, and the impurity concentration in the polysilicon. In the embodiment described, the oxidizing temperature was 850° C., the partial pressure of water vapor was 0.3 atm., and the phosphorus concentration in the polysilicon was $3 \times 10^{20}$ cm$^{-3}$. Under these conditions, a 30 nm thick oxide film was formed on the silicon substrate while a 120 nm thick oxide film was formed on the polysilicon. The resultant structure is shown in FIG. 4C.

Next, an anisotropic etching is performed using a reactive ion etching apparatus with C$_2$F$_6$ and CHF$_3$ gases to leave the oxide films 15' on the sides of the polysilicon 14. The remaining oxide films 15' shown in FIG. 4D act as spacers.

Figure 4E:
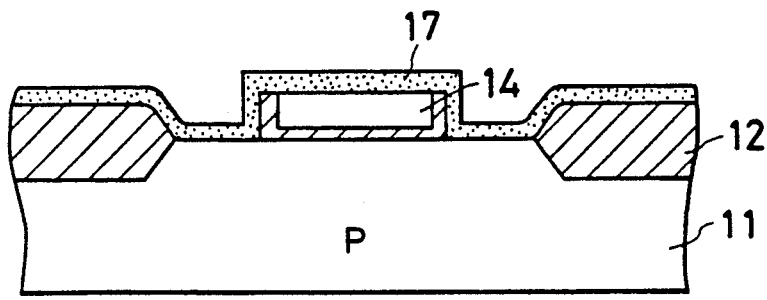

Next, a titanium film 17 of a thickness of about 100 nm is formed throughout the entire surface by sputtering, as shown in FIG. 4E.

Figure 4F:
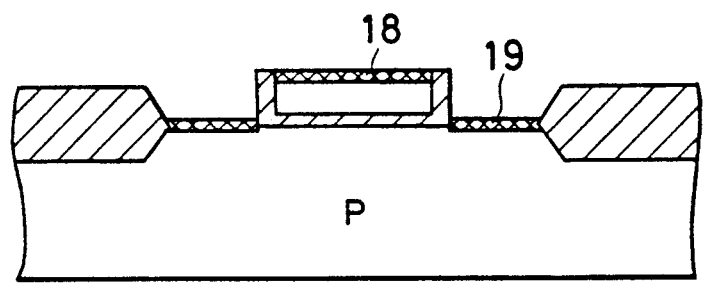

Next, the titanium film 17 is made to react with silicon to form a titanium silicide film. This can be implemented by heating in an argon (Ar) atmosphere at a temperature of 750° C. for 100 sec. For the heating, halogen lamps were used. The titanium silicide films are thus formed on the polysilicon 14 and the silicon substrate 11. The titanium film on the oxide film does not react to form titanium silicide. The unreacted titanium film on the oxide film is removed to leave the titanium silicide film 18 on the polysilicon 14 and the titanium silicide films 19 on the silicon substrate 11. The resultant structure is shown in FIG. 4F.

Figure 4G:
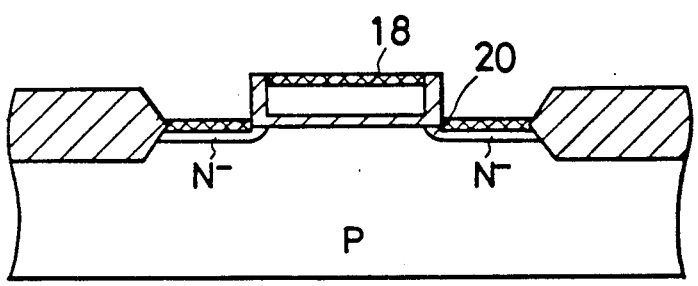

Next, ion implantation of phosphorus is performed using the polysilicon as a mask to form N$^-$ regions 20. The dose of phosphorus is about $5 \times 10^{12}$ cm$^{-2}$ and the implantation energy is 20 KeV to implant ions in the shallow ranges. The resultant structure is shown in FIG. 4G.

Figure 4H:
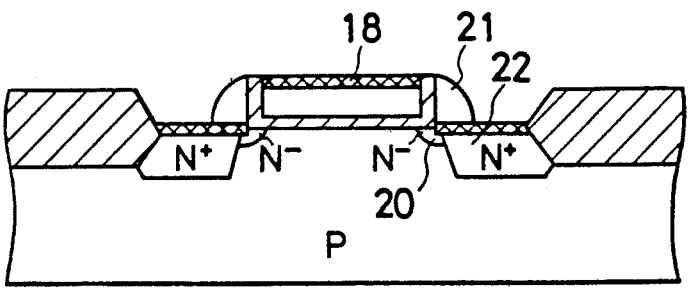

Next, and oxide (SiO$_2$) film is deposited by CVD to a thickness of 300 to 500 nm, and anisotropic etching in the form of reactive ion etching is performed to form spacers 21 on the sides of the polysilicon electrode. The width of the spacers 21 is about 0.2 to 0.3 micrometer. Ion implantation of arsenic (As) is then performed using the polysilicon and the spacers 21 as a mask to form N$^+$ regions 22. The dose of arsenic is $5 \times 10^{15}$ cm$^{-3}$. The resultant structure is shown in FIG. 4H.

Subsequently, an inter-layer insulating film 23 is formed, a contact hole is opened, a metal wiring conductor 24 of aluminum is formed, and finally a protective film 25 is formed to complete the process.

Figure 5:
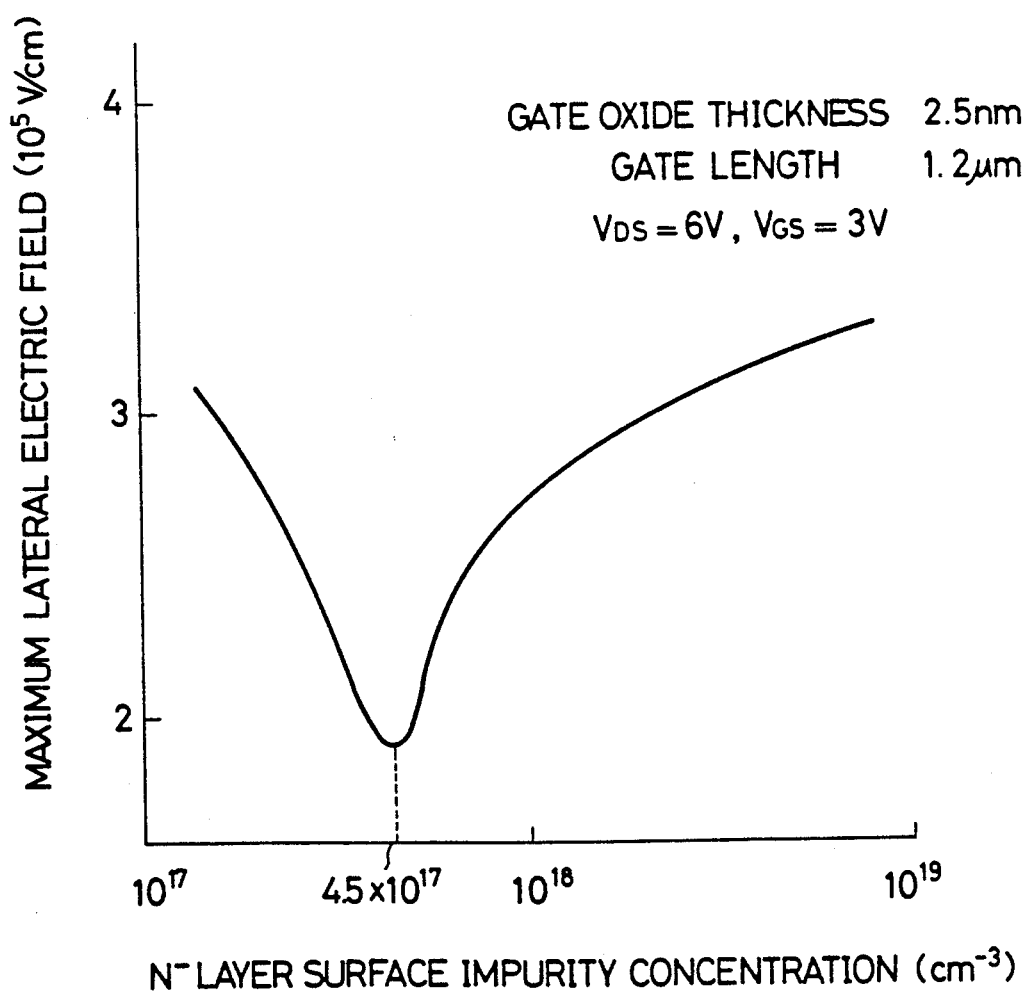
FIG. 5 is the diagram showing a relationship between the surface impurity concentration of the N$^-$ region and the maximum electric field in the lateral direction.

FIG. 5 shows the relationship between the impurity concentration at the surface of the N$^+$ regions and the maximum lateral electric field. Here, the gate oxide film is 25 nm thick, the gate length is 1.2 micrometers, the drain-source voltage V$_{DS}$ is 6V, and the gate-source voltage V$_{GS}$ is 3V. It is seen that to minimize the electric field, the impurity concentration of the N$^-$ regions should be $4.5 \times 10^{17}$ cm$^{-3}$.

In comparison, in the conventional MIS FET, the impurity concentration could not be made as low as $4.5 \times 10^{17}$ cm$^{-3}$. This is because at such a low impurity concentration, the parasitic resistance is too large. The result is that the alleviation of the electric field is inadequate and the degradation due to hot carriers is a problem. In contrast, the provision of the silicide films according to the invention permits the impurity concentration to be lowered to the level of ($4.5 \times 10^{17}$ cm$^{-3}$) giving the minimum electric field. The parasitic resistance is kept low. Thus, the hot carrier injection effect is reduced without an increase in the parasitic resistance or decrease in the conductance.

Moreover, in the conventional MIS FET, when a negative charge is trapped at the interface of or in the oxide film over the N$^-$ regions, the N$^-$ regions are depleted. This phenomenon is also prevented by the invention.

In the embodiment described, titanium silicide is used as the metal silicide. But other silicides of high melting-temperature metals such as tungsten silicide and molybdenum silicide can also be used. Platinum silicide can also be used.

The invention is not limited to the embodiments described above, bu various modifications can be made without departing from the scope and the spirit of the invention.

What is claimed is:

1. A process of fabricating an LDD MIS field effect transistor comprising the steps of:

providing a silicon substrate;

forming a gate insulating film on said substrate;

forming a gate electrode on said gate insulating film;

forming a metal silicide film on said substrate adjacent the side of said gate electrode;

performing a first ion-implantation using the gate electrode as a mask to form a lightly-doped region in the substrate;

forming a spacer on the side of said gate electrode and on said metal silicide film; and performing a second ion-implantation through said metal silicide film using said gate electrode and said spacer as a mask to form a heavily-doped region in the substrate.

2. A process according to claim 1, wherein the insulating film on the side of the gate electrode is silicon oxide, and the step of forming the metal silicide film comprises forming a film of metal over the entire surface of the substrate;

causing reaction of the metal with silicon of the exposed surface of the substrate; and removing the unreacted metal to leave the metal silicide on the substrate adjacent to the gate electrode.

3. A process according to claim 1, wherein said first ion-implantation is performed through said metal silicide film.

4. A method of manufacturing an LDD MIS field effect transistor comprising the steps of:
 providing a silicon substrate;
 forming a gate insulating film on said substrate;
 forming a polysilicon layer on said gate insulating film to form a gate electrode;
 forming an insulating film on the side of said gate electrode;
 forming a metal film over said gate electrode and said silicon substrate;
 reacting a metal with silicon and polysilicon to form a metal silicide layer on said gate electrode and said substrate;
 performing a first ion-implantation using said gate electrode as a mask to form a lightly-doped region in the substrate;
 forming a spacer over the metal silicide layer on said substrate and on the insulating film formed on the side of said gate electrode; and
 performing a second ion-implantation through said metal silicide layer on said substrate using said gate electrode and said spacer as a mask to form a heavily-doped region in the substrate.

5. A method according to claim 4, wherein said step of forming an insulating film on the side of said gate electrode comprises:
 subjecting said substrate to an oxidizing atmosphere to form a silicon oxide film over the substrate and said gate electrode; and
 subjecting the resulting structure to an anisotropic etching to leave said silicon oxide film on the side of said gate electrode.

6. A method according to claim 4, wherein said metal film is a refractory metal film.

7. A method according to claim 6, wherein said refractory metal film is selected from the group consisting of a titanium film, a tungsten film and a molybdenum film.

8. A method according to claim 6, wherein said first ion-implantation is performed through said metal silicide layer.

9. A method according to claim 6 further comprising the step, performed after the formation of the metal silicide layer, of removing the metal that remains unreacted on the side of said insulating film which is on the side of said gate electrode.

10. A process of fabricating an LDD MIS field effect transistor comprising the steps of:
 providing a silicon substrate;
 forming a gate electrode, said gate electrode being separated by a gate insulating film from the substrate;
 forming an insulating film on the side of the gate electrode;
 forming a metal silicide film on the substrate adjacent to the side of the gate electrode;
 performing a first ion-implantation through said metal silicide film using the gate electrode as a mask to form a lightly-doped region in the substrate;
 forming a spacer on the side of the gate electrode and on said metal silicide film; and
 performing a second ion-implantation through the metal silicide film using the gate electrode and the spacer as a mask to form a heavily-doped region in the substrate.

* * * * *